United States Patent
Okuzono et al.

(10) Patent No.: US 8,656,545 B2
(45) Date of Patent: Feb. 25, 2014

(54) CORE FOR WASHING SPONGE ROLLER

(75) Inventors: Noriyoshi Okuzono, Koga (JP); Hiroshi Miyaji, Tokyo (JP); Yoichi Tanaka, Koga (JP)

(73) Assignee: Aion Co., Ltd., Osaka-shi (JP)

( * ) Notice: Subject to any disclaimer, the term of this patent is extended or adjusted under 35 U.S.C. 154(b) by 2500 days.

(21) Appl. No.: 10/596,724

(22) PCT Filed: Dec. 26, 2003

(86) PCT No.: PCT/JP03/17059
§ 371 (c)(1),
(2), (4) Date: Jun. 22, 2006

(87) PCT Pub. No.: WO2005/065849
PCT Pub. Date: Jul. 21, 2005

(65) Prior Publication Data
US 2007/0163066 A1 Jul. 19, 2007

(51) Int. Cl.
*B05C 1/08* (2006.01)
(52) U.S. Cl.
USPC .................................. 15/88.3; 15/102; 15/77
(58) Field of Classification Search
USPC ............ 15/230, 77, 102, 88.2–88.4; 401/197; 118/258, 259; 429/16–18
See application file for complete search history.

(56) References Cited

U.S. PATENT DOCUMENTS

| 4,566,911 | A | 1/1986 | Tomita et al. | |
| 5,806,126 | A | 9/1998 | de Larios et al. | |
| 6,076,217 | A * | 6/2000 | Brunelli et al. | 15/77 |
| 6,240,588 | B1 | 6/2001 | Dickey et al. | |
| 6,247,197 | B1 | 6/2001 | Vail et al. | |
| 6,308,369 | B1 | 10/2001 | Garcia et al. | |
| 6,467,120 | B1 * | 10/2002 | Ziemins et al. | 15/102 |
| 6,543,084 | B2 | 4/2003 | Dickey et al. | |
| 7,032,269 | B2 * | 4/2006 | Mikhaylichenko et al. | 15/102 |

FOREIGN PATENT DOCUMENTS

JP  2001-237209 A  8/2001
WO  WO-00/51752  9/2000

OTHER PUBLICATIONS

Patent Abstracts of Japan for JP2001-237209 published Aug. 31, 2001.
International Search Report for PCT/JP2003/017059 mailed Mar. 16, 2004.

* cited by examiner

*Primary Examiner* — Dung Van Nguyen
(74) *Attorney, Agent, or Firm* — Oliff PLC

(57) ABSTRACT

A core for a cleaning sponge roller and a cleaning sponge roller set include a core and a cleaning sponge roller mounted on the core. The core for the cleaning sponge roller is in a substantially cylindrical shape including a bore extending in an axial direction and a plurality of small holes communicating between the bore and a circumferential outer surface of the core. The diameter of the bore is 10 mm or more. The diameter of the small holes is 2.5 mm or more. A total of cross-sectional areas of openings of all the small holes is larger than a cross-sectional area of the bore.

5 Claims, 4 Drawing Sheets

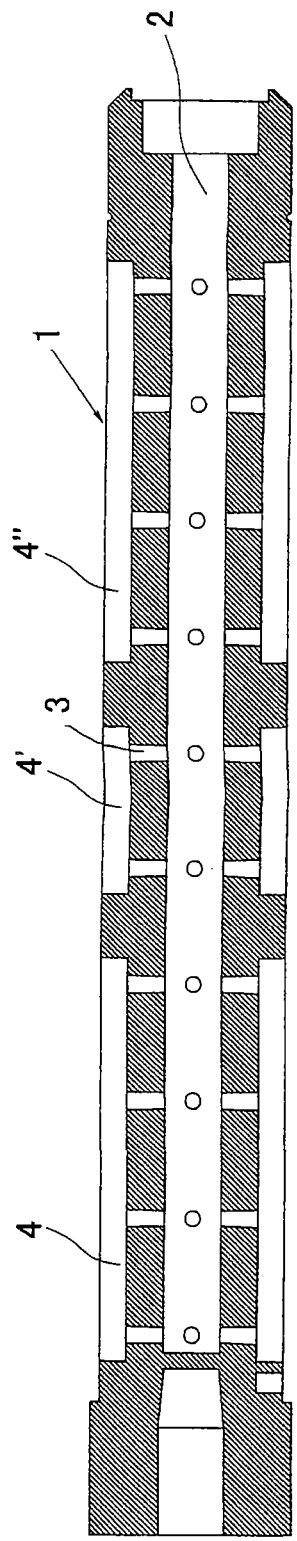
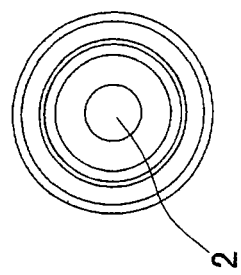
Fig. 1A
Fig. 1B

US 8,656,545 B2

CORE FOR WASHING SPONGE ROLLER

CROSS-REFERENCE TO PRIOR APPLICATION

This is a U.S. National Phase Application under 35 U.S.C. §371 of International Patent Application No. PCT/JP2003/017059 filed Dec. 26, 2003 which is incorporated by reference herein. The International Application was published in Japanese on Jul. 21, 2005 as WO 2005/065849 A1 under PCT Article 21(2).

TECHNICAL FIELD

The present invention relates to a core for a cleaning sponge roller, and more particularly to a core attached to a cleaning sponge roller for use in a cleaning process of the manufacture of substrate.

BACKGROUND ART

In the manufacture of an aluminum hard disc, a glass disk, a wafer, a photo mask, or a liquid glass substrate, or the like, there is carried out a precise polishing, the so-called polishing process, using various grits, such as silicon oxide, alumina, ceria, in order to finish the surface thereof with extremely high precision. After the polishing step, abrasive grains and dust have adhered to the surface of a polished article. Then there is in need of a through clean in order to remove them.

Although there is ultrasonic cleaning or cleaning process using water jet, scrub cleaning with a sponge roller of polyvinyl acetal porous material is more commonly employed in order to attain great cleaning effect or to cause less damage to the substrate. Additionally, as a cleaning fluid, not only DI water but also various chemicals, such as acid, alkali, solvent, suitable for respective substrates, are used. As a cleaning fluid for a silicon wafer, for example, a mixture of ammonia water and oxygenated water, a mixture of diluted hydrofluoric acid, hydrochloric acid and oxygenated water, and the like are known.

Among sponge rollers of polyvinyl acetal porous material, a cylindrical brush roller having many projections on the circumferential surface thereof is commonly used for the cleaning, where the tops of the projections are continuously in contact with the surface of an article to be cleaned while the sponge roller is being rotated so that good cleaning effect is achieved (see U.S. Pat. No. 4,566,911). Since the contacts with the article to be cleaned are made only in the projections, there are, in comparison with a sponge roller having a smooth surface, advantages such as less friction, less damage to the article to be cleaned, or an advantage that dirt is readily passing thorough between the projections together with the cleaning fluid and thus removed from the article to be cleaned.

In a cleaning process respective dedicated cleaning devices for each of substrates are usually used. In any of the devices, it is common to rotate a sponge roller together with a core, which is connected to a rotation driver and around which is covered with the sponge roller, while the tops of the projections of the roller are made contact with an article to be cleaned.

In some devices a cleaning fluid is supplied through a nozzle or the like onto the upper portion or side of an article to be cleaned or a sponge roller, and it is practically carried out to supply the cleaning fluid into the sponge roller from the inside of the core so as to enhance the cleaning capability. In the latter case the core in a cylindrical shape has a hollow, and the cleaning fluid is introduced at one end of the core and then supplied into the sponge roller through holes communicating between the hollow portion and the outer surface of the core, and then flows out onto the outer surface of the sponge roller.

In U.S. Pat. No. 6,240,588 there is disclosed a brush core characterized by having a first plurality of holes aligned along a line in an axial direction of the core and a second plurality of holes aligned along a line in an axial direction of the core, where the first plurality of holes being located to offset relative to the second plurality of holes, the first plurality of holes and the second plurality of holes are alternately repeated around the core, and the first plurality of holes and the second plurality of holes are located in the channels recessed in the outer surface of the core. The bore defined through a middle of the core has a diameter of 0.060~0.35 inches (1.524~8.89 mm).

In U.S. Pat. No. 6,543,084 there is disclosed a brush core comprising an elongated member, the elongated member having a plurality of fluid discharge surfaces around and spaced from the central axis thereof, the plurality of fluid discharge surfaces being spaced from one another, and the elongated member has a fluid supply bore at its center with a diameter of 0.060~0.35 inches (1.524~8.89 mm), the elongated member having a plurality of holes communicating between the fluid supply bore and the fluid discharge surfaces. The plurality of holes communicating between the fluid supply bore and the fluid discharge surfaces each have a diameter of 0.005~0.092 inches (0.127~2.34 mm).

In U.S. Pat. No. 6,308,369 there is disclosed a brush assembly in a wafer cleaning system comprising a brush core having channels cut into the surface in an axial direction, a first cylindrical sleeve being concentric with the brush core, and a second sleeve (a brush body), the channels allowing a fluid to flow in an axial direction and then to the first and second sleeves.

In U.S. Pat. Nos. 6,247,197 and 5,806,126 there are disclosed devices having a cleaning brush mounted thereon.

In the conventional devices, however, there was a problem that the supply of a cleaning fluid from a core to a sponge roller was extremely nonuniform, and thus it was difficult to flow out the cleaning fluid evenly over the outer surface of the roller.

Furthermore, in the cleaning step a plurality of different types of cleaning fluid are often used in turn, and when the cleaning fluid in use is changed to another cleaning fluid, there is a problem that the cleaning fluid previously used remains in the bore of a core or in a cleaning sponge roller, and it took a long time to change the cleaning fluids.

DISCLOSURE OF THE INVENTION

The present invention is to provide a core for a cleaning sponge roller with which it is possible to distribute a cleaning fluid evenly over the entire outer surface area of the core, that is, to supply the cleaning fluid evenly to the sponge roller, and the replacement of the cleaning fluid is finished quickly upon change of the cleaning fluids. In the core of the conventional sponge roller, the very small area of the opening portion of small holes in communication with the bore portion was one of the reasons that the supply of the cleaning fluid to the sponge roller was extremely uneven and therefore it was difficult to flow out the cleaning fluid evenly over the outer surface of the roller.

The present invention relates to a substantially cylindrical core for a cleaning sponge roller having a bore extending in an axial direction and a plurality of small holes communicating between the bore and the circumferential outer surface of the core, characterized in that the diameter of the bore is 10 mm or more and the diameter of the small hole is 2.5 mm or more, and a total of the cross section areas of the openings of all the small holes is larger than the cross section area of the bore.

BRIEF DESCRIPTION OF THE DRAWINGS

FIGS. 1A to 1D in combination show an exemplary core for a cleaning sponge roller according to the present invention, FIG. 1A is a cross sectional view along an axial direction of the core, and FIG. 1B is a right side elevation view of the core, FIG. 1D is a front elevation view of the core, and FIG. 1C is a side cross sectional view along the line B-B of FIG. 1D. FIG. 1D' is a front elevation view of the core in another aspect different from that shown in FIG. 1D.

FIG. 2A is a cross sectional view along an axial direction of the core and FIG. 2B is a right side elevation view of the core.

BEST MODES FOR CARRYING OUT THE INVENTION

Figure 1C:
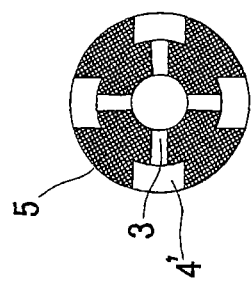

With reference to FIGS. 1A to 1D of the drawing, the present invention will be described. FIG. 1A is a cross sectional view of an exemplary core for a cleaning sponge roller of the present invention, FIG. 1B is a right side elevation view thereof, and FIG. 1C is a side cross sectional view along the line B-B. As shown in FIGS. 1A to 1D, core 1 is a tubular cylindrical shape, having a bore 2 extending in a longitudinal direction and a plurality of small holes 3 communicating between the bore 2 and the outer surface 5 of the core. The diameter of the bore is 10 mm or more, preferably 10 mm to 20 mm, more specifically 12 mm to 15 mm, and the diameter of the small holes is 2.5 mm or more, preferably 2.5 mm to 5 mm, more specifically 2.8 mm to 4 mm. Additionally, a total of the cross section areas of the openings of all the small holes is larger than the cross section area of the bore, preferably 1.2 to 5 times larger, more specifically 1.5 to 3 times larger. As exemplified in the drawing, in case where, for example, the diameter of the bore is 10 mm and the diameter of the small hole is 2.5 mm, the cross sectional area of the bore is approximately 0.785 cm$^2$, and as the number of the small holes is 40, the total cross section areas of the openings of all the small holes is approximately 1.96 cm$^2$, which is approximately 2.5 times larger than the cross section area of the bore. Taking such configuration can reduce the pressure loss of fluid in the small holes, and thus the pressure of a fluid supply can be set lower. Accordingly, since a cleaning fluid spreads gradually into the sponge roller through the small holes, the cleaning fluid can be supplied uniformly all over the surface of the sponge roller through the small holes without the cleaning fluid flowing out locally over the outer surface of the sponge roller. In addition, since there is no portion where the cleaning fluid can hardly be replaced due to the short pass upon change of the cleaning fluid, the change of the cleaning fluid can be finished quickly.

The plurality of small holes formed in the core of the present invention are preferably distributed over both in a circumferential direction and in an axial direction of the core, and aligned along a line in the axial direction. Additionally, the small holes placed in one of the lines and the small holes placed in an adjacent line are arranged on the same circumference of the core. For instance, in case the arrangement as shown in FIG. 1D and the arrangement in FIG. 1D' are adjacent to each other, the small holes each at the ends of the respective arrangements are on the same circumference, and so are the second and third holes and so forth from the ends.

There are a plurality of grooves 4, 4', 4" recessed in the circumferential outer surface of the core in an axial direction of the core, and in the respective grooves there is at least one small hole opening, preferably two small holes or more, and each of the grooves forms a cleaning fluid reserving and distributing area. The width of the groove is preferably at least twice as large as the diameter of the small hole.

Figure 1D:
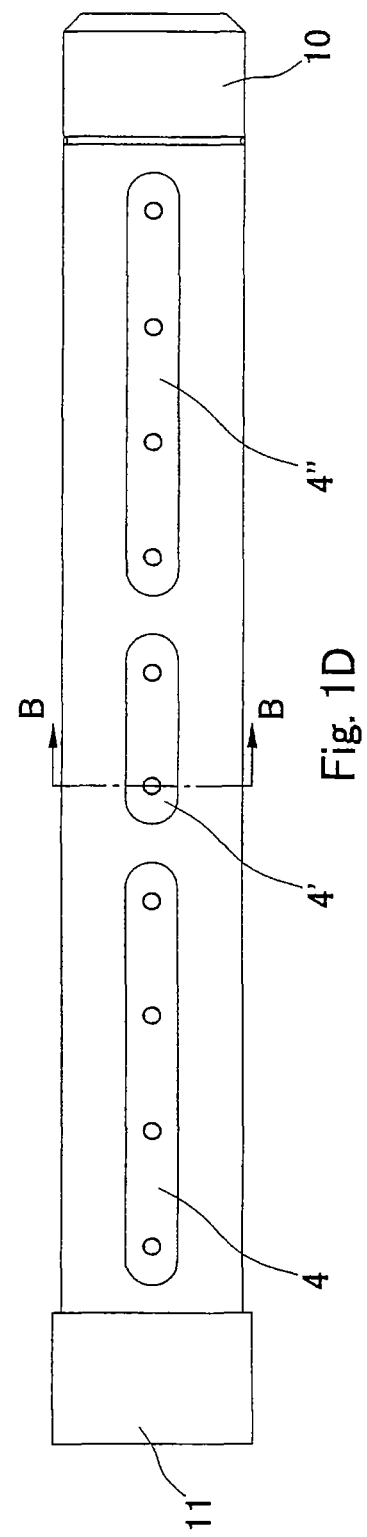
Figure 1D:
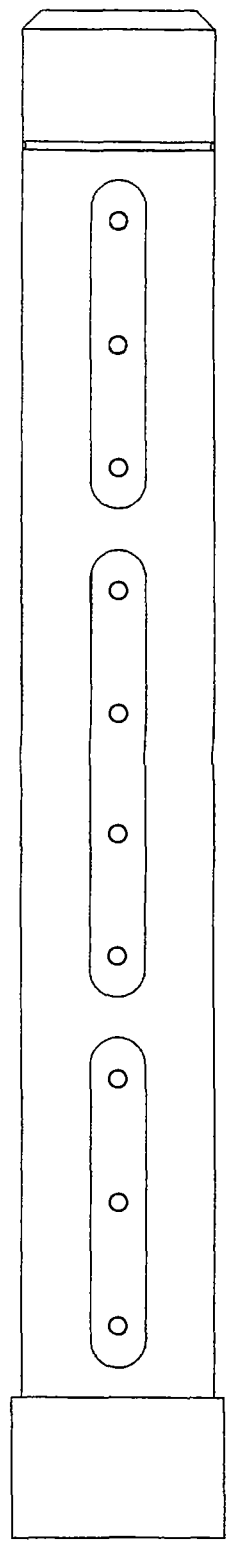

In FIG. 1D, four small holes open into groove 4, two into groove 4', and four into groove 4". The number of the small holes opening into one groove is ordinarily 2 to 5, and more preferably 2 to 4. The number of the small holes opening into one groove is preferably a repeat pattern of 2, 3, or 4, or a pattern of 2 and 3, 2 and 4, or 3 and 4 in an axial direction of the core. For example, when the total number of the small holes arranged in one axial-line is 10, a preferable pattern is (2, 2, 2, 2, 2), (2, 3, 3, 2), (4, 2, 4) or (3, 4, 3). Although there is no limitation on the total number of the small holes arranged in one axial line, it may ordinarily be chosen from the range of 5 to 20. The space between the small holes adjacent to each other may be the same for all the small holes, and however the space at the ends may be different from the space in the middle. These patterns are appropriately set so that the flow of the cleaning fluid both in an axial direction and in a circumferential direction of the core can be controlled thereby to achieve the optimum cleaning effect. If the opening portion of the small hole would make contact directly with the inner surface of the sponge roller, the distribution of the cleaning fluid could tend to be uneven. In order to avoid it, the above described grooves form the stagnant distribution areas, and the cleaning fluid can be supplied evenly and quickly in the longitudinal direction of the sponge roller (not shown) mounted on the outer surface 5 of the core.

In the circumferential direction of the core, preferably 4 to 8, more preferably 4 to 6, grooves are positioned at even intervals. In FIG. 1C, four grooves are positioned at even intervals. It is especially desirable that in adjacent grooves in the circumferential direction of the core, the numbers of the small holes are different from one another. For example, the numbers of the small holes are (4, 3, 4, 3) in the respective ends in the circumferential direction, and (4, 2, 4) and (3, 4, 3) in an axial direction, respectively. It corresponds to the patterns as shown in FIG. 1D and in FIG. 1D' alternately repeated every 90 degrees. Alternatively, there are (2, 4, 4, 2) in the respective ends in the circumferential direction, and (2, 3, 3, 2) and (4, 2, 4) in an axial direction, respectively. Those configurations allow a cleaning fluid to be supplied evenly and quickly in the rotational direction of a sponge roller (not shown).

One end portion 11 of the core is a sleeve to be inserted into a rotation driver (not shown) of the cleaning device, and a bore 2 closes at the end portion 11. At the other end portion 10 of the core, bore 2 opens, and a cleaning fluid supply pipe (not shown) is connected to the end portion 10. The axial length and diameter of the outer surface 5 of the core depend respectively on the axial length and inner diameter of the sponge roller, and may be respectively in the ranges of 50 to 500 mm and of 15 to 100 mm.

From the end portion 10 the cleaning sponge roller is being mounted onto the core to complete a cleaning sponge roller set. As the cleaning sponge roller itself, the well-known cleaning sponge roller, as disclosed in U.S. Pat. No. 4,566,911, can be utilized.

Preferably, either the end portion 10 or both the end portions 10 and 11 are configured as flanges with diameters larger than the diameter of the outer surface 5 of the core and may be detachable by means of, for example, a screw or screws. In this case the sponge roller is mounted on the core with the flange or flanges being detached, and then the flange or flanges are fitted and fixed for utilization of the sponge roller. The flange has an advantage of preventing the sponge roller from shifting axially during the cleaning process.

Figure 2A:
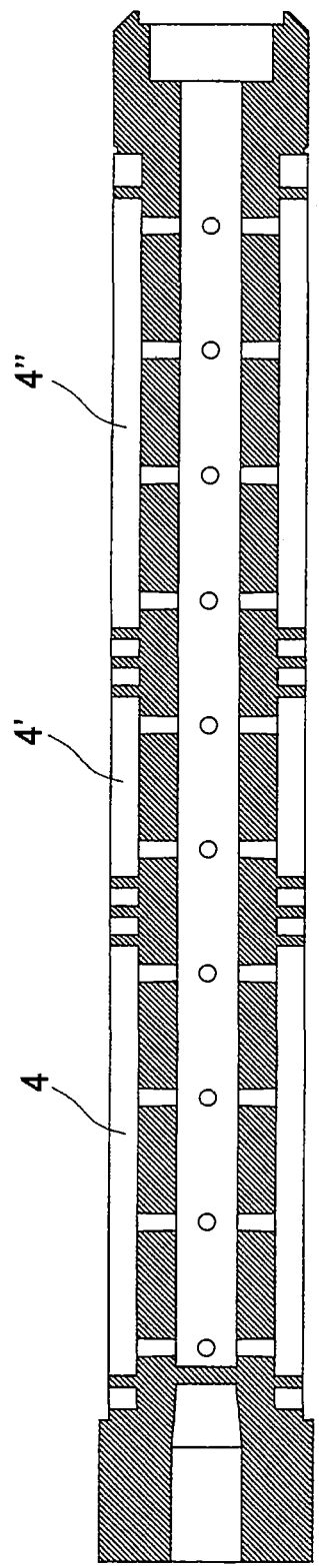
FIGS. 2A to 2B in combination show a core for a cleaning sponge roller according to another embodiment of the present invention.
Figure 2B:
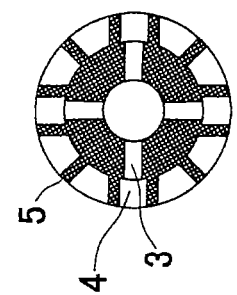

As illustrated in FIGS. 2A and 2B in accordance with another embodiment of the present invention, the portions of the outer peripheral surface between the grooves both in an axial direction and in a circumferential direction may be configured not to be continuous but to be partially cut out. This configuration can result not only in reduction of the material costs but also in weight saving. There is especially no limitation of the materials, and in consideration of the strength and resistance to chemicals to be used, the materials may be chosen as may be needed from among polyethylene, polypropylene, polyacetal, polycarbonate, fluoroplastics, and rigid polyvinyl chloride. Additionally, for a method for forming the core, for example, injection molding, casting molding, or grinding may be selected as the case may be.

INDUSTRIAL APPLICABILITY

The present invention provides a core on which a cleaning sponge roller is mounted for use in a process of cleaning a disk, wafer, and the like.

The invention claimed is:

1. A core for a cleaning sponge roller, the core being in a substantially cylindrical shape comprising:
    a bore extending in an axial direction and a plurality of small holes communicating between the bore and a circumferential outer surface of the core, the plurality of small holes are distributed both in a circumferential direction and in an axial direction of the core and aligned along straight lines in the axial direction, small holes in one of the straight lines and small holes in a straight line adjacent to the one of the straight lines are arranged on one and the same circumference of the core; and
    grooves recessed in the circumferential outer surface of the core and extending in the axial direction of the core, the small holes opening into the grooves,
    wherein:
        a diameter of the bore is 10 to 20 mm;
        a diameter of the small holes is 2.5 to 5 mm; and
        a total of cross-sectional areas of the plurality of the small holes is 1.2 to 5 times larger than a cross-sectional area of the bore.

2. A core for a cleaning sponge roller as in claim 1, wherein the number of the small holes opening into one groove is 2 to 5.

3. A core for a cleaning sponge roller as in claim 2, wherein the number of the small holes opening into one groove in the axial direction of the core takes a repeat pattern of 2, 3, or 4, or a pattern of 2 and 3, 2 and 4, or 3 and 4.

4. A core for a cleaning sponge roller as in claim 2, wherein in the circumferential direction of the core, either four or six grooves are positioned at even intervals, and different numbers of the small holes open into the adjacent grooves, where the number of the small holes takes a repeat pattern in the circumferential direction of the core.

5. A core for a cleaning sponge roller as in claim 1, wherein at least one flange is attached either to one end or to both ends of the core.

* * * * *